(12) United States Patent
Ishii et al.

(10) Patent No.: US 8,802,994 B2
(45) Date of Patent: Aug. 12, 2014

(54) PRINTED CIRCUIT BOARD AND METHOD OF MANUFACTURING THE SAME

(75) Inventors: Jun Ishii, Ibaraki (JP); Daisuke Yamauchi, Ibaraki (JP)

(73) Assignee: Nitto Denko Corporation, Ibaraki-shi, Osaka (JP)

(*) Notice: Subject to any disclaimer, the term of this patent is extended or adjusted under 35 U.S.C. 154(b) by 180 days.

(21) Appl. No.: 13/456,824

(22) Filed: Apr. 26, 2012

(65) Prior Publication Data

US 2012/0279757 A1 Nov. 8, 2012

Related U.S. Application Data

(60) Provisional application No. 61/489,328, filed on May 24, 2011.

(30) Foreign Application Priority Data

May 6, 2011 (JP) ................................. 2011-103608

(51) Int. Cl.
*H05K 1/03* (2006.01)
*H05K 1/00* (2006.01)
*H05K 1/11* (2006.01)

(52) U.S. Cl.
USPC ........... 174/255; 174/252; 174/262; 174/264; 174/265; 174/266

(58) Field of Classification Search
USPC .................................. 174/262–266, 252, 255
See application file for complete search history.

(56) References Cited

U.S. PATENT DOCUMENTS

| | | | |
|---|---|---|---|
| 5,796,552 A * | 8/1998 | Akin et al. ................. 360/264.2 |
| 5,943,212 A * | 8/1999 | Horiuchi et al. ............. 361/704 |
| 6,040,524 A * | 3/2000 | Kobayashi et al. ............ 174/36 |
| 6,399,899 B1 * | 6/2002 | Ohkawa et al. .............. 174/261 |
| 6,480,359 B1 * | 11/2002 | Dunn et al. ................. 360/245.9 |
| 2006/0118330 A1 | 6/2006 | Ooyabu et al. |
| 2009/0008137 A1 * | 1/2009 | Yokai et al. .................... 174/255 |

FOREIGN PATENT DOCUMENTS

JP 2006-165268 A 6/2006

* cited by examiner

*Primary Examiner* — Timothy Thompson
*Assistant Examiner* — Sherman Ng
(74) *Attorney, Agent, or Firm* — Panitch Schwarze Belisario & Nadel LLP

(57) ABSTRACT

An insulating layer is formed on a support substrate having a conductive property. Write wiring traces, read wiring traces, and first and second electrode pad pairs are formed on the insulating layer. The first electrode pad pair is connected to the write wiring traces. The second electrode pad pair is connected to the read wiring traces. Parts of regions of the support substrate, which overlap the electrode pads, are removed. Thus, openings are formed in the regions of the support substrate, which overlap the electrode pads.

6 Claims, 17 Drawing Sheets

F I G. 2
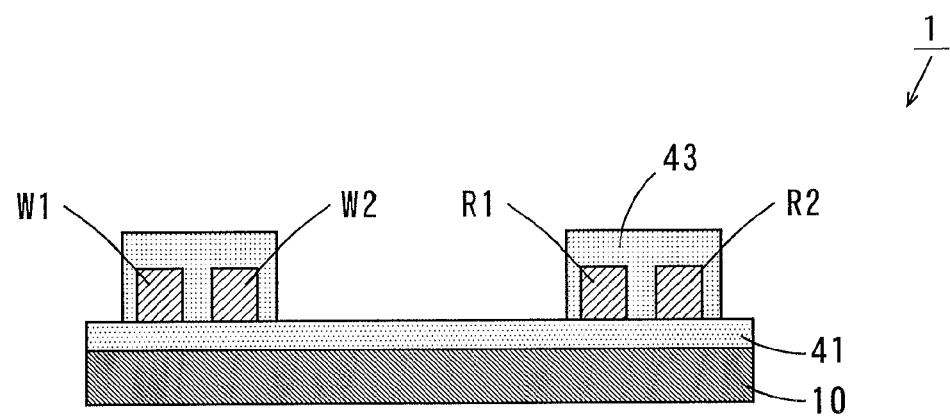

F I G. 3
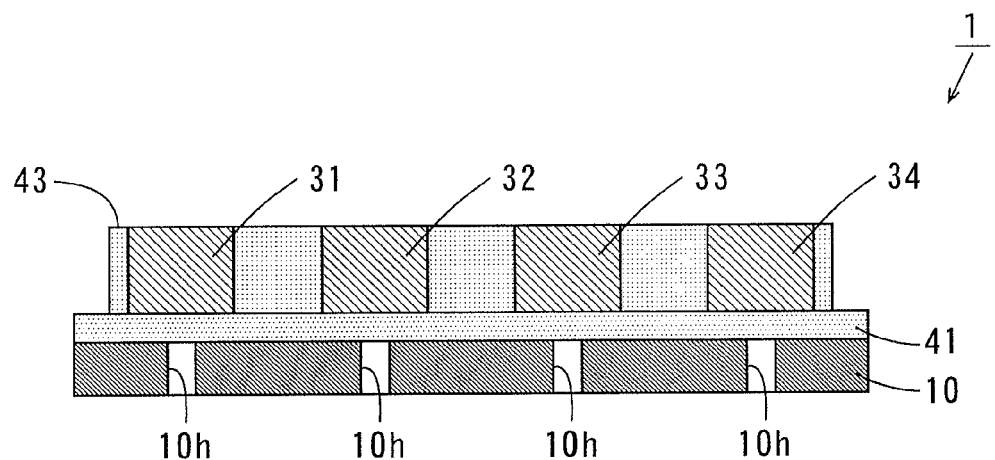
F I G. 4
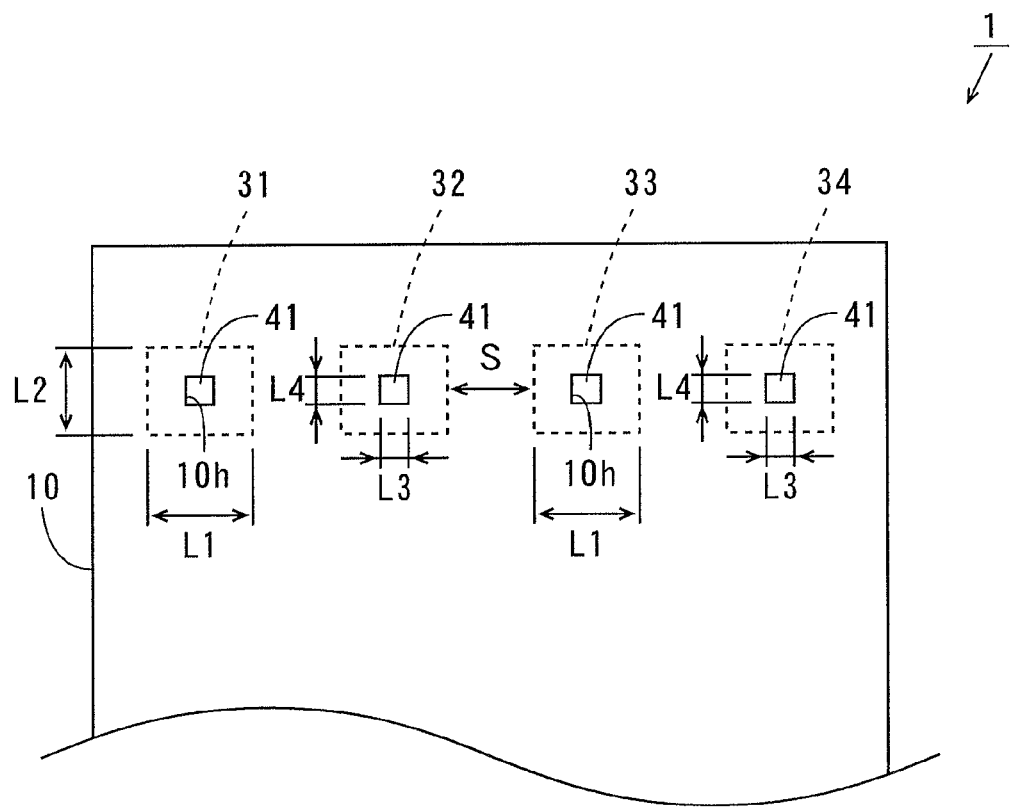

FIG. 14
(a)
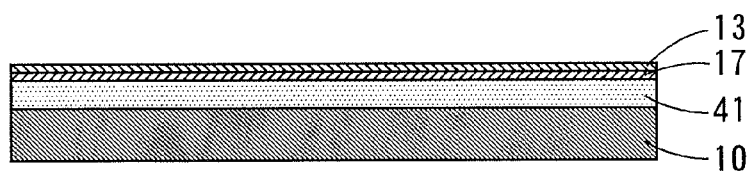
(b)
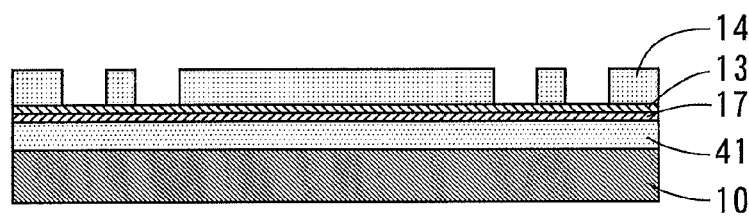
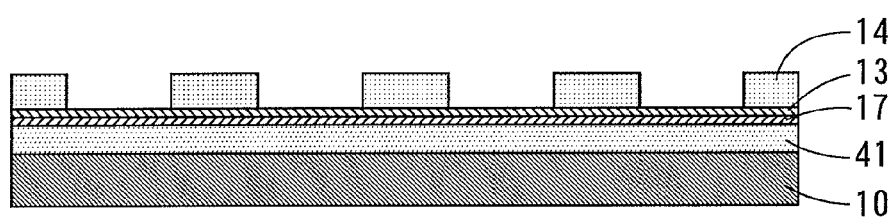

F I G. 1 8
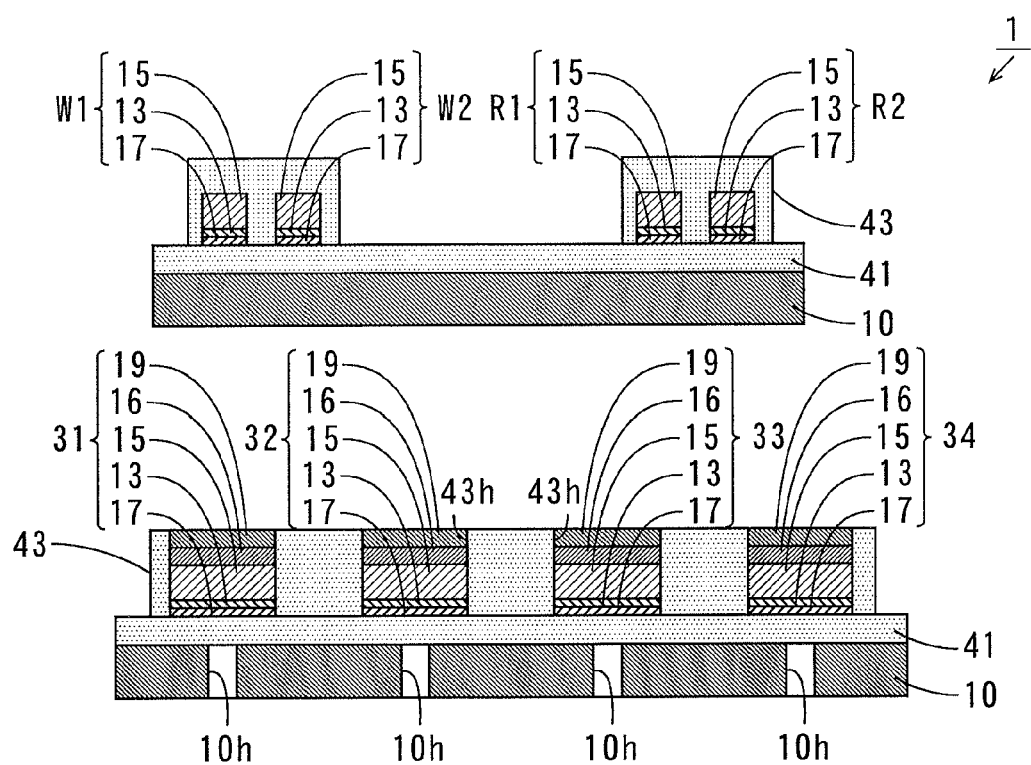

PRINTED CIRCUIT BOARD AND METHOD OF MANUFACTURING THE SAME

BACKGROUND OF THE INVENTION (1) Field of the Invention

The present invention relates to a printed circuit board and a method for manufacturing the same.

(2) Description of Related Art

Actuators are used in drives such as hard disk drives. Such an actuator includes an arm provided rotatably around a rotation shaft, and a suspension board for a magnetic head that is attached to the arm. The suspension board is a printed circuit board for positioning the magnetic head at a desired track of a magnetic disk.

A suspension board with a circuit discussed in JP 2006-165268 A includes a conductor trace including a terminal for a magnetic head, a wiring, and a terminal for a relay. The terminal for a magnetic head in the suspension board with a circuit is connected to the magnetic head. The terminal for a relay in the suspension board with a circuit is connected to a relay flexible printed circuit board. Between the relay flexible printed circuit board and the magnetic head, an electrical signal is transmitted via the conductor trace of the suspension board with a circuit.

BRIEF SUMMARY OF THE INVENTION

In a printed circuit board, a characteristic impedance of not only a wiring but also a terminal is desirably adjusted to a desired value. A characteristic impedance of the terminal can be adjusted by changing the area of the terminal. However, in a suspension board with a circuit, the characteristic impedance is difficult to adjust optionally due to dimensional constraints of the terminal.

The present invention is directed to providing a printed circuit board in which a characteristic impedance of a connection terminal can be adjusted optionally and a method for manufacturing the same.

(1) According to an aspect of the present invention, a printed circuit board that can be electrically connected to an external circuit includes a support substrate formed of a conductive material, a first insulating layer formed on the support substrate, a plurality of wiring traces formed on the first insulating layer, and a plurality of connection terminals that are respectively formed in parts of the plurality of wiring traces on the first insulating layer and can be electrically connected to the external circuit, in which one or a plurality of openings are formed in the support substrate to at least partially overlap one or more of the plurality of connection terminals.

In the printed circuit board, the plurality of wiring traces are formed on the first insulating layer on the support substrate while the plurality of connection terminals that can be electrically connected to the external circuit are respectively formed in the parts of the plurality of wiring traces. The one or plurality of openings are formed in the support substrate to at least partially overlap one or more of the plurality of connection terminals.

In this case, a capacitive component of the connection terminal below which the opening is formed is selectively reduced. A characteristic impedance of the connection terminal that overlaps the opening is higher than a characteristic impedance of the connection terminal that does not overlap the opening. The characteristic impedance of the connection terminal differs depending on the area of the opening that overlaps the connection terminal. Therefore, the characteristic impedance of the connection terminal can be adjusted optionally by adjusting the area of the opening that overlaps the connection terminal.

(2) The plurality of connection terminals may include first and second connection terminals, and the one or plurality of openings may include one or a plurality of first openings that at least partially overlap the first connection terminal and one or a plurality of second openings that at least partially overlap the second connection terminal.

In this case, a characteristic impedance of the first connection terminal can be adjusted optionally by adjusting the number or the area of first openings that overlap the first connection terminal. A characteristic impedance of the second connection terminal can be adjusted optionally by adjusting the number or the area of second openings that overlap the second connection terminal.

(3) The sum of the areas of the one or plurality of first openings that overlap the first connection terminal and the sum of the areas of the one or plurality of second openings that overlap the second connection terminal may differ.

In this case, the characteristic impedances of the first and second connection terminals differ. Even if terminals or wirings having different characteristic impedances of the external circuit are respectively connected to the first and second connection terminals, therefore, impedance matching can be achieved.

(4) When the ratio of the area of the opening, which overlaps each of the connection terminals, to the area of the connection terminal is defined as an aperture ratio, the aperture ratio of the one or plurality of first openings and the aperture ratio of the one or plurality of second openings may differ.

In this case, the characteristic impedances of the first and second connection terminal differ. Even if terminals or wirings having different characteristic impedances of the external circuit are respectively connected to the first and second connection terminals, therefore, impedance matching can be achieved.

(5) The one or plurality of openings may be formed so that the characteristic impedance of one of the plurality of connection terminal is lower than the characteristic impedance of the other connection terminal.

In this case, the characteristic impedance of the one connection terminal can be made lower than the characteristic impedance of the other connection terminal. If the characteristic impedance of one of the terminals or wirings of the external circuit is lower than the characteristic impedance of the other terminal or wiring, the one terminal or wiring of the external circuit is connected to the one connection terminal and the other terminal or wiring of the external circuit is connected to the other connection terminal so that impedance matching with the one terminal or wiring can be achieved while impedance matching with the other terminal or wiring can be achieved.

(6) The printed circuit board may further include a second insulating layer formed on the first insulating layer to cover the plurality of wiring traces while exposing surfaces of the plurality of connection terminals.

In this case, the external circuit can be easily connected to the plurality of connection terminals while ensuring corrosion resistance of the wiring traces.

(7) According to another aspect of present invention, a method for manufacturing a printed circuit board that can be electrically connected to an external circuit includes the steps of preparing a laminated structure of a support substrate having a conductive property and an insulating layer, forming a plurality of wiring traces on the insulating layer while forming a plurality of connection terminals, which can be electrically connected to the external circuit, respectively, in parts of the plurality of wiring traces, and forming one or a plurality of openings on the support substrate to at least partially overlap one or more of the plurality of connection terminals.

In the method for manufacturing the printed circuit board, the plurality of wiring traces are formed on the insulating layer on the support substrate having a conductive property while the plurality of connection terminals that can be electrically connected to the external circuit are respectively formed in the parts of the plurality of wiring traces. The one or plurality of openings are formed in the support substrate to at least partially overlap one or more of the plurality of connection terminals.

In this case, a capacitive component of the connection terminal below which the opening is formed is selectively reduced. A characteristic impedance of the connection terminal that overlaps the opening is higher than a characteristic impedance of the connection terminal that does not overlap the opening. The characteristic impedance of the connection terminal differs depending on the area of the opening that overlaps the connection terminal. Therefore, the characteristic impedance of the connection terminal can be adjusted optionally by adjusting the area of the opening that overlaps the connection terminal.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 2 is a cross-sectional view taken along a line A-A of the suspension board illustrated in FIG. 1;

FIG. 3 is a cross-sectional view of a suspension board, illustrating a first example of formation of openings below electrode pads;

FIG. 4 is a bottom view of the suspension board illustrated in FIG. 3;

FIGS. 14 (a) and (b) are schematic sectional views illustrating steps of manufacturing the suspension board illustrated in FIG. 1;

FIG. 18 is a schematic sectional view illustrating steps of manufacturing the suspension board illustrated in FIG. 1;

DESCRIPTION OF THE PREFERRED EMBODIMENTS

A printed circuit board according to an embodiment of the present invention and a method for manufacturing the same will be described below with reference to the drawings. A configuration of a suspension board with a circuit (hereinafter referred to as a suspension board) used for an actuator in a hard disk drive as an example of the printed circuit board according to the embodiment of the present invention, and a method for manufacturing the same will be described below.

(1) Configuration of Suspension Board

Figure 1:
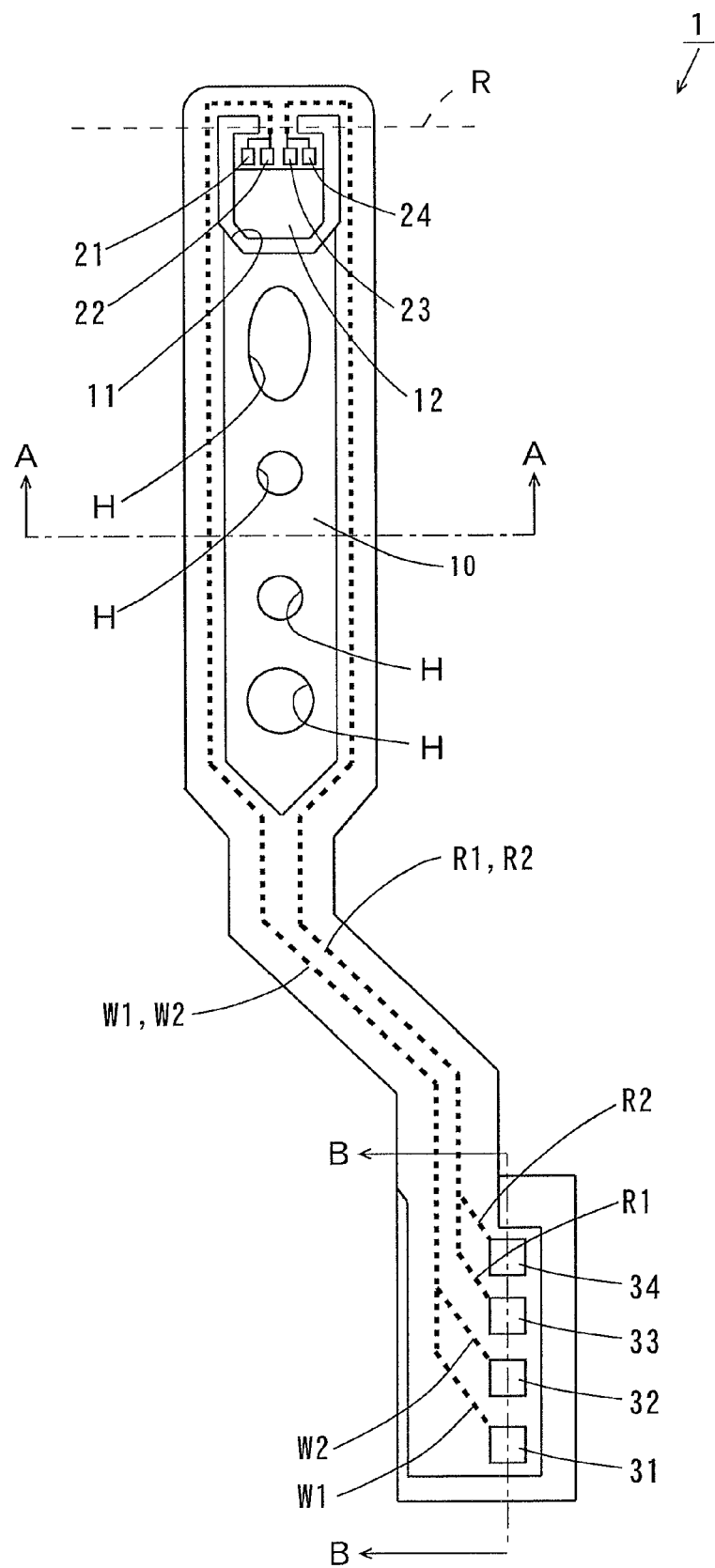
FIG. 1 is a top view of a suspension board according to an embodiment of present invention.

FIG. 1 is a top view of a suspension board according to an embodiment of the present invention. As illustrated in FIG. 1, a suspension board 1 includes a support substrate 10 formed of a conductive material such as stainless steel, for example. A pair of linear write wiring traces W1 and W2 and a pair of linear read wiring traces R1 and R2 are formed on the support substrate 10. In FIG. 1, the pair of linear write wiring traces W1 and W2 and the pair of linear read wiring traces R1 and R2 are illustrated by thick dotted lines, respectively.

At one end (a tip) of the support substrate 10, a magnetic head supporting portion (hereinafter referred to as a tongue) 12 is provided by forming a U-shaped opening 11. The tongue 12 is bent along a broken line R to form a predetermined angle with the support substrate 10. At an end of the tongue 12, four electrode pads 21, 22, 23 and 24 are formed as a plurality of terminals. In a width direction of the read wiring traces R1 and R2 and the write wiring traces W1 and W2, the width of each of the electrode pads 21 to 24 is greater than the width of each of the read wiring traces R1 and R2 and the write wiring traces W1 and W2.

At the other end of the support substrate 10, four electrode pads 31, 32, 33 and 34 are formed as a plurality of terminals. In the width direction of the read wiring traces R1 and R2 and the write wiring traces W1 and W2, the width of each of the electrode pads 31 to 34 is greater than the width of each of the read wiring traces R1 and R2 and the write wiring traces W1 and W2.

The electrode pads 21 and 22 on the tongue 12 and the electrode pads 31 and 32 on the other end of the support substrate 10 are electrically connected to each other by the write wiring traces W1 and W2, respectively. The electrode pads 23 and 24 on the tongue 12 and the electrode pads 33 and 34 on the other end of the support substrate 10 are electrically connected to each other by the read wiring traces R1 and R2, respectively. Further, a plurality of holes H are formed in the support substrate 10.

In a hard disk device (not illustrated) including the suspension board 1, a current flows in the pair of write wiring traces W1 and W2 when information is written into the magnetic disk. A current flows in the pair of read wiring traces R1 and R2 when information is read from the magnetic disk.

The write wiring traces W1 and W2 and the read wiring traces R1 and R2 in the suspension board 1 and their peripheral portions will be described in detail below. FIG. 2 is a cross-sectional view taken along a line A-A of the suspension board illustrated in FIG. 1.

As illustrated in FIG. 2, an insulating layer 41 made of polyimide, for example, is formed on the support substrate 10. The write wiring traces W1 and W2 and the read wiring traces R1 and R2 are spaced apart and parallel to each other on the insulating layer 41.

In the present embodiment, the write wiring trace W1 and the write wiring trace W2 constitute a signal line pair. The read wiring trace R1 and the read wiring trace R2 constitute a signal line pair. A coating layer 43 made of polyimide, for example, is formed on the insulating layer 41 to cover the write wiring traces W1 and W2 and the read wiring traces R1 and R2.

As described below, openings are respectively formed in regions of the support substrate 10 below the electrode pads 21 to 24 and the electrode pads 31 to 34 illustrated in FIG. 1.

(2) First Example of Formation of Opening Below Electrode Pad

FIG. 3 is a cross-sectional view of a suspension board 1, illustrating a first example of formation of openings below electrode pads 31 to 34. FIG. 4 is a bottom view of the suspension board 1 illustrated in FIG. 3. FIG. 3 illustrates a cross-sectional view taken along a line B-B of the suspension board 1 illustrated in FIG. 1.

As illustrated in FIG. 3, an insulating layer 41 is formed on a support substrate 10. The rectangular electrode pads 31 to 34 are equally spaced apart from one another on the insulating layer 41. The electrode pads 31 to 34 are respectively connected to the write wiring traces W1 and W2 and the read wiring traces R1 and R2 illustrated in FIG. 2. A coating layer 43 is formed on the insulating layer 41 to expose respective upper surfaces of the electrode pads 31 to 34.

Parts of the regions of the support substrate 10, which respectively overlap the plurality of electrode pads 31 to 34, are removed. Thus, a plurality of the openings 10h are formed in the regions of the support substrate 10, which respectively overlap the plurality of electrode pads 31 to 34. Therefore, parts of the insulating layer 41 are exposed in the openings 10h.

In an example illustrated in FIG. 4, each of the openings 10h has a rectangular shape. The width L3 of each of the openings 10h in a width direction of the suspension board 1 is smaller than the width L1 of the corresponding one of electrode pads 31 to 34. The width L4 of each of the openings 10h in a longitudinal direction of the suspension board 1 is smaller than the width L2 of the corresponding one of electrode pads 31 to 34.

The width L1 of each of the electrode pads 31 to 34 is not less than 50 μm nor more than 500 μm, for example. The width L2 of each of the electrode pads 31 to 34 is not less than 50 μm nor more than 500 μm, for example. A spacing S between the adjacent electrode pads 31 and 32, a spacing S between the adjacent electrode pads 32 and 33, and a spacing S between the adjacent electrode pads 33 and 34 are not less than 50 μm nor more than 500 μm, for example. The width L3 of each of the openings 10h is not less than 20 μm nor more than 200 μm, for example. The width L4 of each of the openings 10h is not less than 20 μm nor more than 200 μm, for example.

(3) Second Example of Formation of Opening Below Electrode Pad

Figure 5:
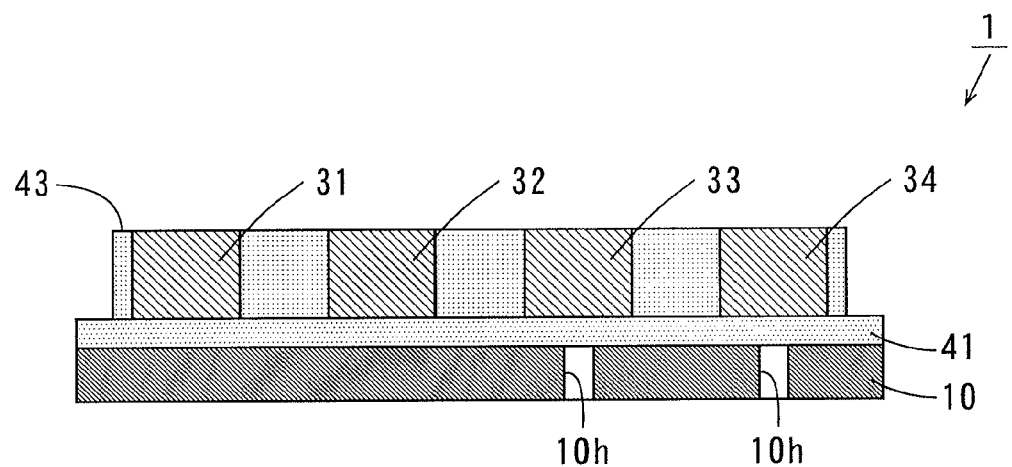
FIG. 5 is a cross-sectional view of a suspension board, illustrating a second example of formation of openings below electrode pads.
Figure 6:
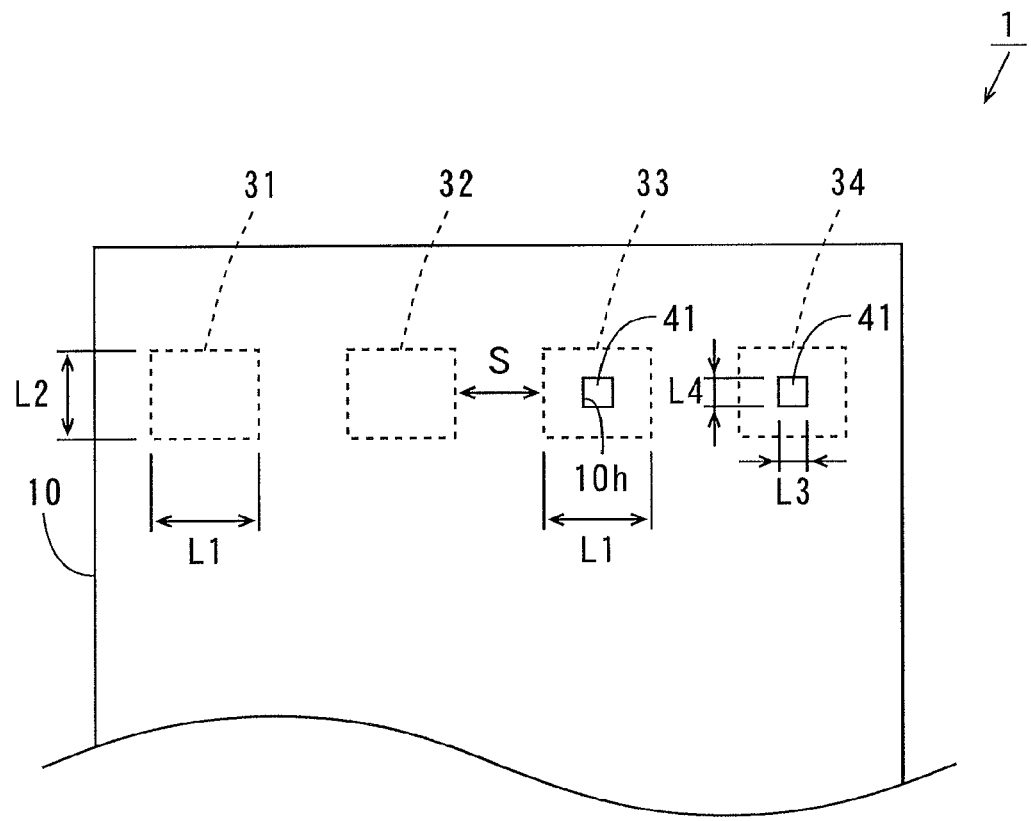
FIG. 6 is a bottom view of the suspension board illustrated in FIG. 5.

FIG. 5 is a cross-sectional view of a suspension board 1, illustrating a second example of formation of openings 10h below electrode pads 31 to 34. FIG. 6 is a bottom view of the suspension board 1 illustrated in FIG. 5.

As illustrated in FIGS. 5 and 6, regions of a support substrate 10, which respectively overlap the electrode pads 31 and 32, are not removed. Thus, no openings 10h are formed in the regions of the support substrate 10, which respectively overlap the electrode pads 31 and 32. On the other hand, parts of regions of the support substrate 10, which respectively overlap the electrode pads 33 and 34, are removed. Thus, respective openings 10h having the same area are formed in the regions of the support substrate 10, which respectively overlap the electrode pads 33 and 34.

The area of the opening 10h, which overlaps each of the electrode pads 31 to 34, divided by the area of the region of the support substrate 10, which overlaps the electrode pad (the area of the electrode pads 31 to 34) is hereinafter referred as an aperture ratio of the opening 10h.

In the suspension board 1 illustrated in FIGS. 5 and 6, no openings 10h are formed in the regions of the support substrate 10, which respectively overlap the electrode pads 31 and 32, and the openings 10h are formed in the regions of the support substrate 10, which respectively overlap the electrode pads 33 and 34. In this case, an aperture ratio of the opening 10h corresponding to each of the electrode pads 31 and 32 is zero. Therefore, an aperture ratio of the opening 10h corresponding to each of the electrode pads 33 and 34 is higher than the aperture ratio of the opening 10h corresponding to each of the electrode pads 31 and 32. Therefore, a characteristic impedance of the electrode pads 33 and 34 respectively connected to the read wiring traces R1 and R2 can be made higher than a characteristic impedance of the electrode pads 31 and 32 respectively connected to the write wiring traces W1 and W2.

(4) Third Example of Formation of Opening Below Electrode Pad

Figure 7:
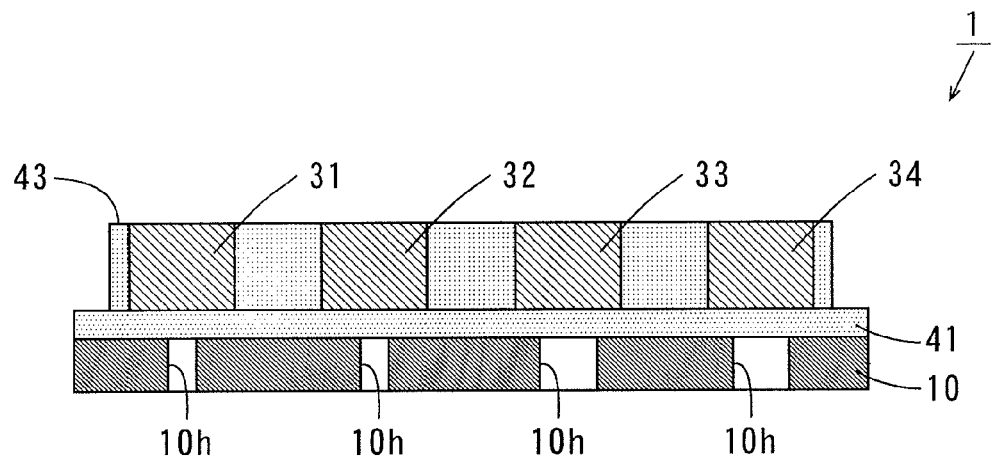
FIG. 7 is a cross-sectional view of a suspension board, illustrating a third example of formation of openings below electrode pads.
Figure 8:
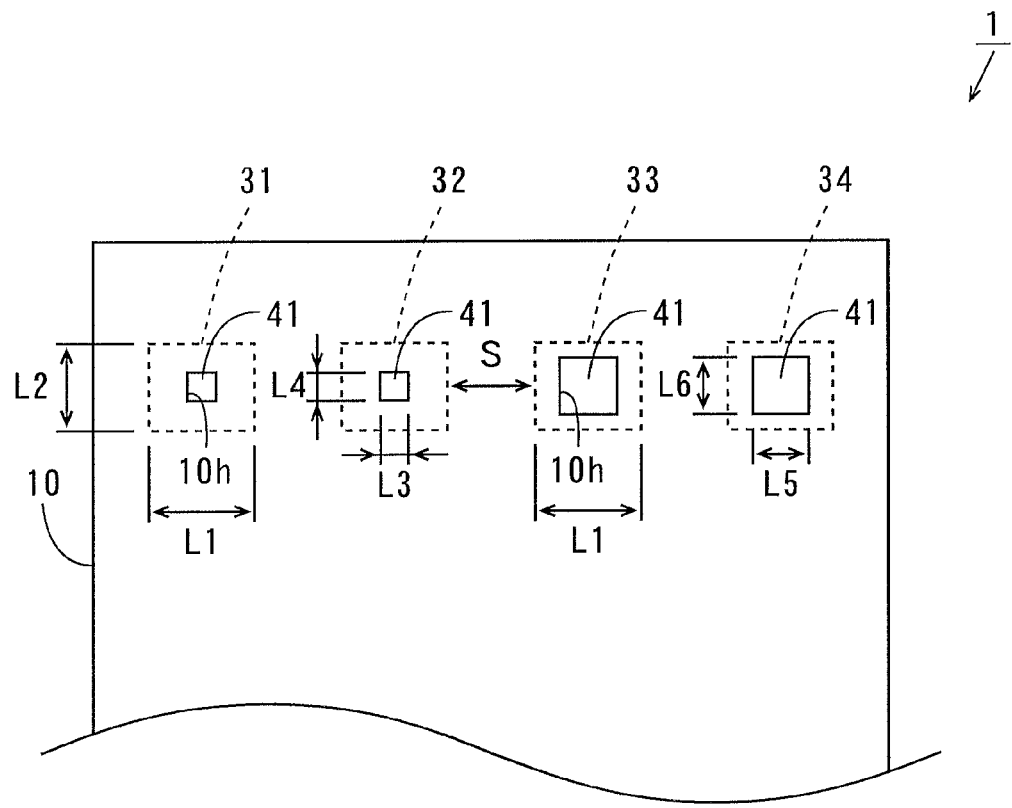
FIG. 8 is a bottom view of the suspension board illustrated in FIG. 7.

FIG. 7 is a cross-sectional view of a suspension board 1, illustrating a third example of formation of openings 10h below electrode pads 31 to 34. FIG. 8 is a bottom view of the suspension board 1 illustrated in FIG. 7.

As illustrated in FIGS. 7 and 8, parts of regions of a support substrate 10, which respectively overlap the plurality of electrode pads 31 to 34, are removed. In this example, the openings 10h are respectively formed in the regions of the support substrate 10, which respectively overlap the plurality of electrode pads 31 to 34. In this example, the width L5 of the openings 10h corresponding to the electrode pads 33 and 34 is greater than the width L3 of the openings 10h corresponding to the electrode pads 31 and 32, and is smaller than the width L1 of the electrode pads 33 and 34. The width L6 of the openings 10h corresponding to the electrode pads 33 and 34 is greater than the width L4 of the openings 10h corresponding to the electrode pads 31 and 32, and is smaller than the width L2 of the electrode pads 33 and 34. In this case, the area of the openings 10h corresponding to the electrode pads 33 and 34 is greater than the area of the openings 10h corresponding to the electrode pads 31 and 32. Therefore, an aperture ratio of the opening 10h corresponding to each of the electrode pads 33 and 34 is higher than an aperture ratio of the opening 10h corresponding to each of the electrode pads 31 and 32.

Thus, in the suspension board 1 illustrated in FIGS. 7 and 8, the openings 10h are formed in the regions of the support substrate 10, which respectively overlap the plurality of electrode pads 31 to 34. Therefore, a characteristic impedance of the plurality of electrode pads 31 to 34 can be made higher than when no openings 10h are formed. The aperture ratio of the opening 10h corresponding to each of the electrode pads 33 and 34 is higher than the aperture ratio of the opening 10h corresponding to each of the electrode pads 31 and 32. Therefore, the characteristic impedance of the electrode pads 33 and 34 respectively connected to the read wiring traces R1 and R2 can be made higher than the characteristic impedance of the electrode pads 31 and 32 respectively connected to the write wiring traces W1 and W2.

(5) Fourth Example of Formation of Opening Below Electrode Pad

Figure 9:
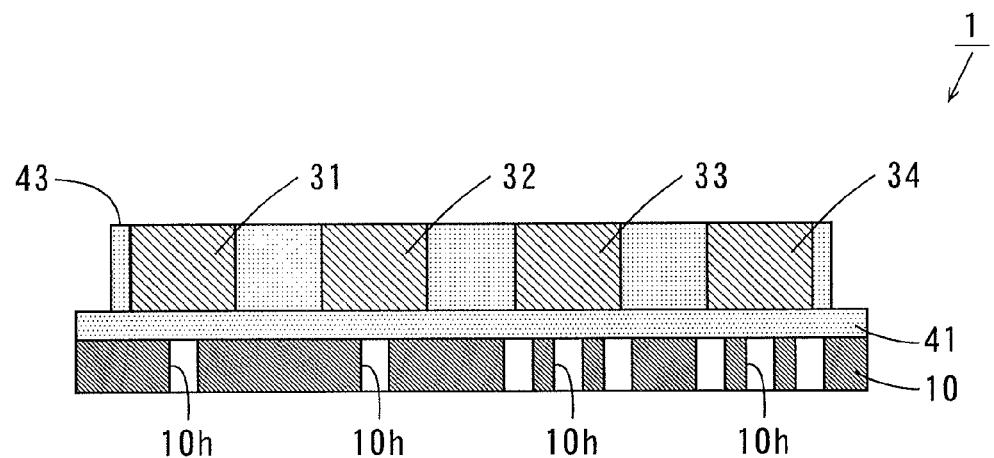
FIG. 9 is a cross-sectional view of a suspension board, illustrating a fourth example of formation of openings below electrode pads.
Figure 10:
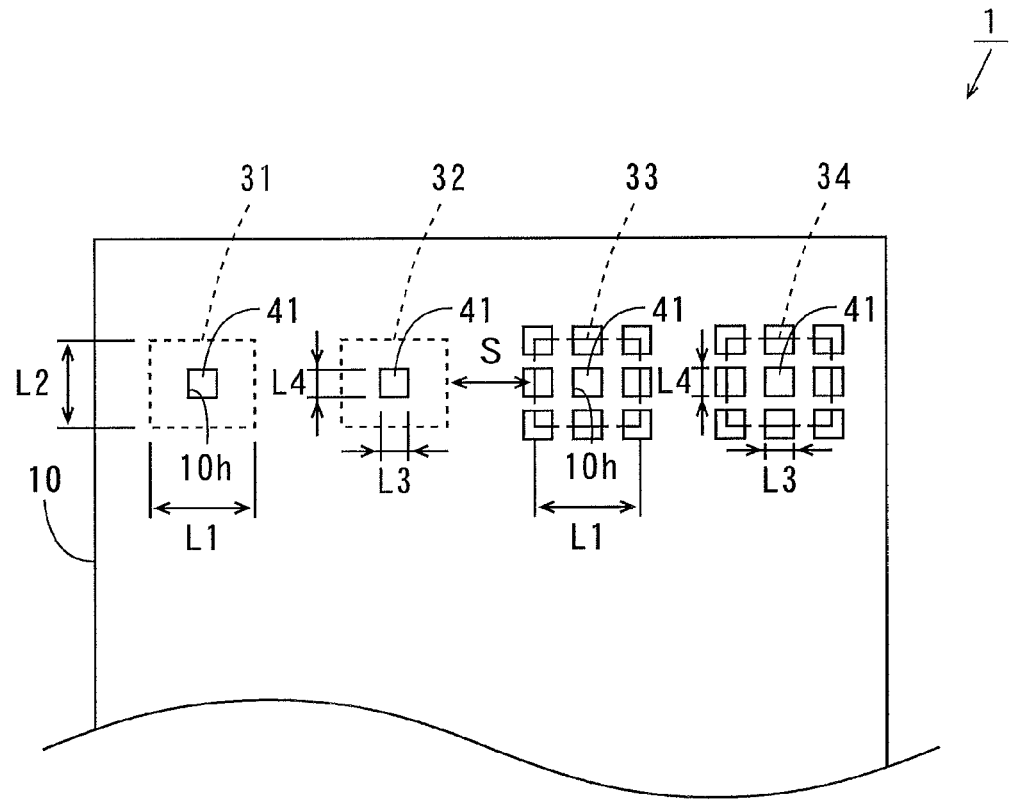
FIG. 10 is a bottom view of the suspension board illustrated in FIG. 9.

FIG. 9 is a cross-sectional view of a suspension board, illustrating a fourth example of formation of openings 10h below electrode pads 31 to 34. FIG. 10 is a bottom view of the suspension board 1 illustrated in FIG. 9.

As illustrated in FIGS. 9 and 10, respective openings 10h having the same area are formed in regions of a support substrate 10, which respectively overlap the electrode pads 31 and 32. On the other hand, a plurality of openings 10h having the same area are formed in each of regions of the support substrate 10, which respectively overlap the electrode pads 33 and 34. The area of each of the plurality of openings 10h formed in each of the regions of the support substrate 10, which respectively overlap the electrode pads 33 and 34, is equal to the area of the one opening 10h formed in each of the regions of the support substrate 10, which respectively overlap the electrode pads 31 and 32. The number of openings 10h (nine openings 10h in the example illustrated in FIG. 10) corresponding to each of the electrode pads 33 and 34 is greater than the number of openings 10h (one opening 10h in the example illustrated in FIG. 10) corresponding to each of the electrode pads 31 and 32.

In this example, parts of some of the plurality of openings 10h are positioned outside of the region of the support substrate 10, which overlaps each of the electrode pads 33 and 34. The eight openings 10h, other than the central opening 10h, out of the nine openings 10h corresponding to the electrode pad 33 partially overlap the electrode pad 33. Similarly, the eight openings 10h, other than the central opening 10h, other than out of the nine openings 10h corresponding to the electrode pad 34 partially overlap the electrode pad 34.

In this case, an aperture ratio of the openings 10h corresponding to the electrode pad 33 is obtained by dividing the sum of the areas of respective parts, which overlap the electrode pad 33, of the plurality of openings 10h corresponding to the electrode pad 33 by the area of the electrode pad 33. Similarly, an aperture ratio of the openings 10h corresponding to the electrode pad 34 is obtained by dividing the sum of the areas of respective parts, which overlap the electrode pad 34, of the plurality of openings 10h corresponding to the electrode pad 34 by the area of electrode pad 34. In this example, the aperture ratio of the openings 10h corresponding to each of the electrode pads 33 and 34 is higher than an aperture ratio of the opening 10h corresponding to each of the electrode pads 31 and 32.

Thus, in the suspension board 1 illustrated in FIGS. 9 and 10, the openings 10h are formed in the regions of the support substrate 10, which respectively overlap the plurality of electrode pads 31 to 34. Therefore, a characteristic impedance of each of the plurality of electrode pads 31 to 34 can be made higher than when no openings 10h are formed. The aperture ratio of the openings 10h corresponding to each of the electrode pads 33 and 34 is higher than the aperture ratio of the openings 10h corresponding to each of the electrode pads 31 and 32. Therefore, the characteristic impedance of the electrode pads 33 and 34 respectively connected to the read wiring traces R1 and R2 can be made higher than the characteristic impedance of the electrode pads 31 and 32 respectively connected to the write wiring traces W1 and W2.

(6) Fifth Example of Formation of Opening Below Electrode Pad

Figure 11:
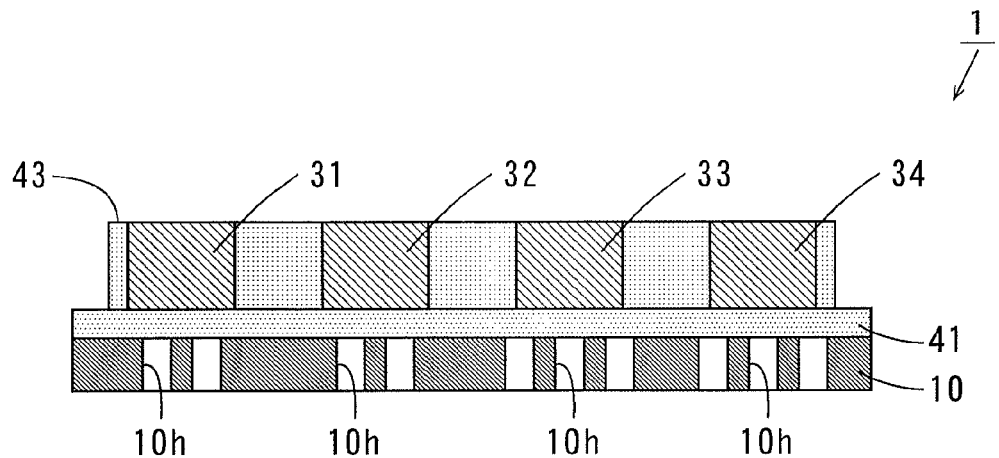
FIG. 11 is a cross-sectional view of a suspension board, illustrating a fifth example of formation of openings below electrode pads.
Figure 12:
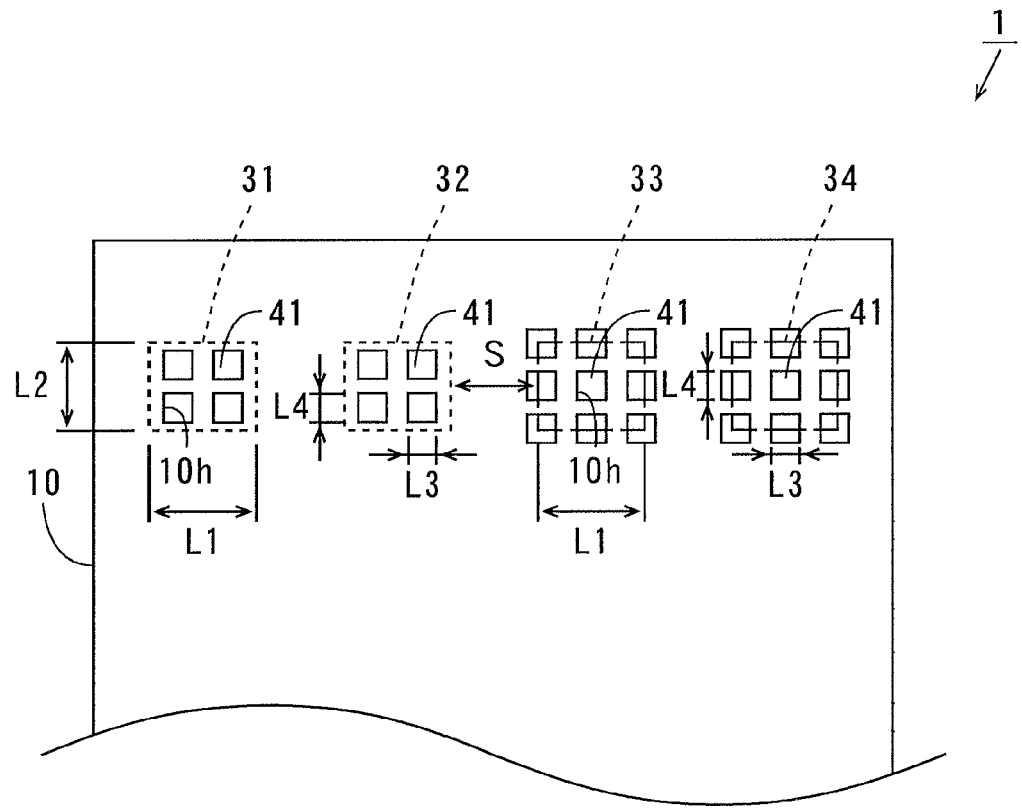
FIG. 12 is a bottom view of the suspension board illustrated in FIG. 11.

FIG. 11 is a cross-sectional view of a suspension board 1, illustrating a fifth example of formation of openings below electrode pads 31 to 34. FIG. 12 is a bottom view of the suspension board 1 illustrated in FIG. 11.

As illustrated in FIGS. 11 and 12, a plurality of openings 10h having the same area are formed in each of regions of a support substrate 10, which respectively overlap the electrode pads 31 to 34. The number of openings 10h (nine openings 10h in the example illustrated in FIG. 12) formed in the region of the support substrate 10, which overlaps each of the electrode pads 33 and 34, is greater than the number of openings 10h (four openings 10h in the example illustrated in FIG. 12) formed in the region of the support substrate 10, which overlaps each of the electrode pads 31 and 32.

The four openings 10h corresponding to each of the electrode pads 31 and 32 totally overlap each of the electrode pads 31 and 32. Parts of some of the plurality of openings 10h are positioned outside of the region of the support substrate 10, which overlaps each of the electrode pads 33 and 34. The eight openings 10h, other than the central opening 10h, out of the nine openings 10h corresponding to each of the electrode pads 33 and 34 partially overlap each of the electrode pads 33 and 34. In this example, an aperture ratio of the openings 10h corresponding to each of the electrode pads 33 and 34 is higher than an aperture ratio of the openings 10h corresponding to each of the electrode pads 31 and 32.

Thus, in the suspension board 1 illustrated in FIGS. 11 and 12, the openings 10h are formed in the regions of the support substrate 10, which respectively overlap the plurality of electrode pads 31 to 34. Therefore, a characteristic impedance of each of the plurality of electrode pads 31 to 34 can be made higher than when no openings 10h are formed. The aperture ratio of the openings 10h corresponding to each of the electrode pads 33 and 34 is higher than the aperture ratio of the openings 10h corresponding to each of the electrode pads 31 and 32. Therefore, the characteristic impedance of the electrode pads 33 and 34 respectively connected to the read wiring traces R1 and R2 can be made higher than the characteristic impedance of the electrode pads 31 and 32 respectively connected to the write wiring traces W1 and W2.

(7) Method for Manufacturing Suspension Board

Figure 13:
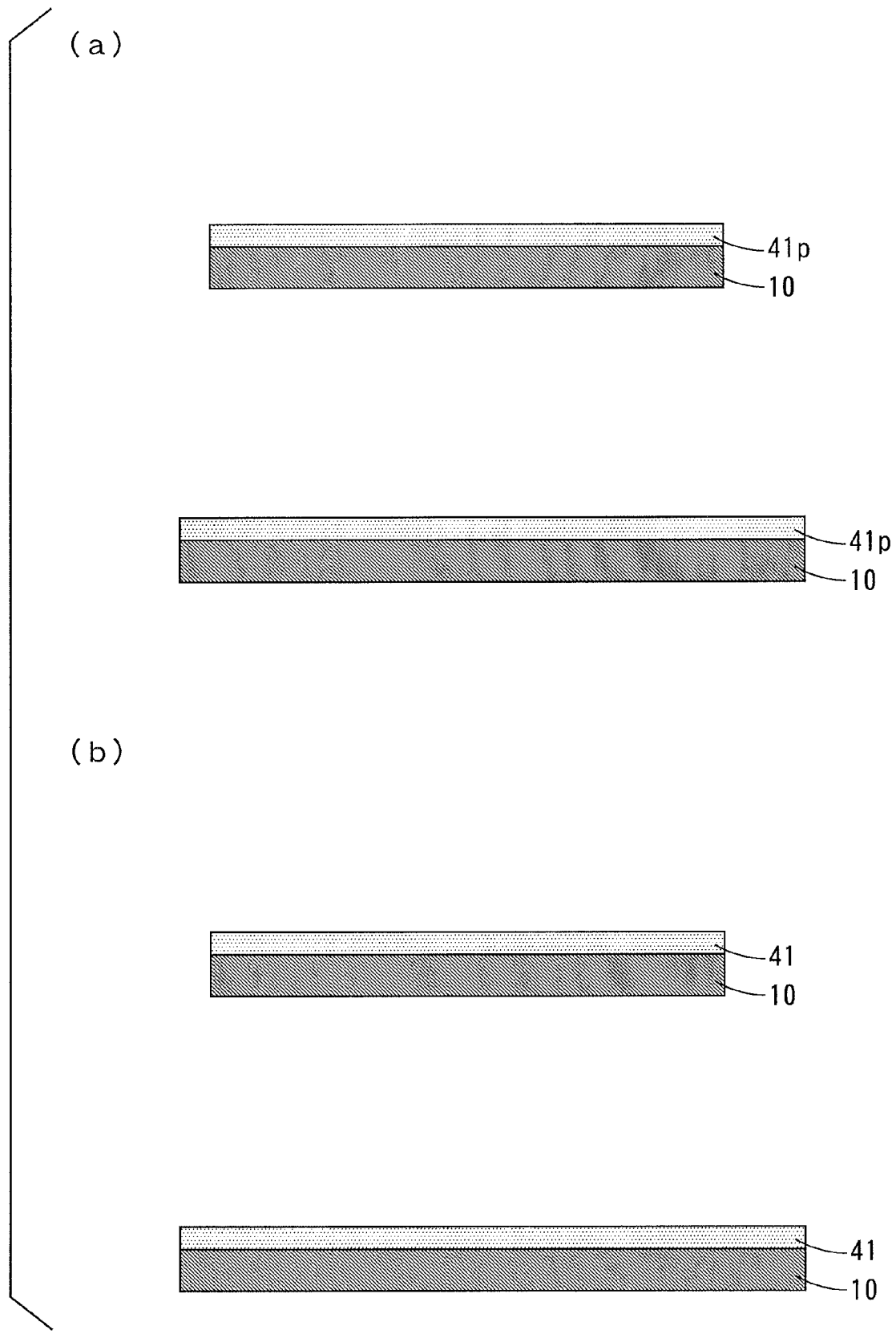
FIGS. 13 (a) and (b) are schematic sectional views illustrating steps of manufacturing the suspension board illustrated in FIG. 1.

Steps of manufacturing the suspension board 1 illustrated in FIG. 1 will be described. FIGS. 13 to 18 are schematic sectional views illustrating the steps of manufacturing the suspension board 1 illustrated in FIG. 1. FIGS. 13 (*a*) to 17 (*b*) and FIG. 18 respectively illustrate cross sections taken along the line A-A of the suspension board 1 illustrated in FIG. 1 in their upper portions. FIGS. 13 (*a*) to 17 (*b*) and FIG. 18 respectively illustrate cross sections taken along the line B-B of the suspension board 1 illustrated in FIG. 1 in their lower portions. While steps of manufacturing the suspension board 1 for the first example of formation of the openings 10*h* will be described in this example, steps of manufacturing the suspension board 1 for the second to fifth examples of formation of the openings 10*h* is similar to the steps of manufacturing the suspension board 1 for the first example of formation of the openings 10*h*.

First, as illustrated in FIG. 13 (*a*), a support substrate 10 composed of stainless steel is coated with a photosensitive polyimide resin precursor 41*p*. The thickness of the support substrate 10 is not less than 10 μm nor more than 50 μm, for example. Then, as illustrated in FIG. 13 (*b*), the photosensitive polyimide resin precursor 41*p* on the support substrate 10 is irradiated with ultraviolet rays of not less than 200 mJ/cm$^2$ nor more than 700 mJ/cm$^2$ via a predetermined mask in an exposure device. Thus, an insulating layer 41 made of polyimide is formed. The thickness of the insulating layer 41 is not less than 8 μm nor more than 15 μm, for example.

Then, as illustrated in FIG. 14 (*a*), a chromium film 17 having a thickness of not less than 100 Å nor more than 600 Å, for example, and a copper plating base 13 having a thickness of not less than 500 Å nor more than 2000 Å and having a sheet resistance of 0.6 Ω/□ or less, for example, are formed in this order on the support substrate 10 and the insulating layer 41 by continuous sputtering of chromium and copper. As illustrated in FIG. 14 (*b*), a resist 14 for plating having a predetermined trace is formed on the copper plating base 13.

Figure 15:
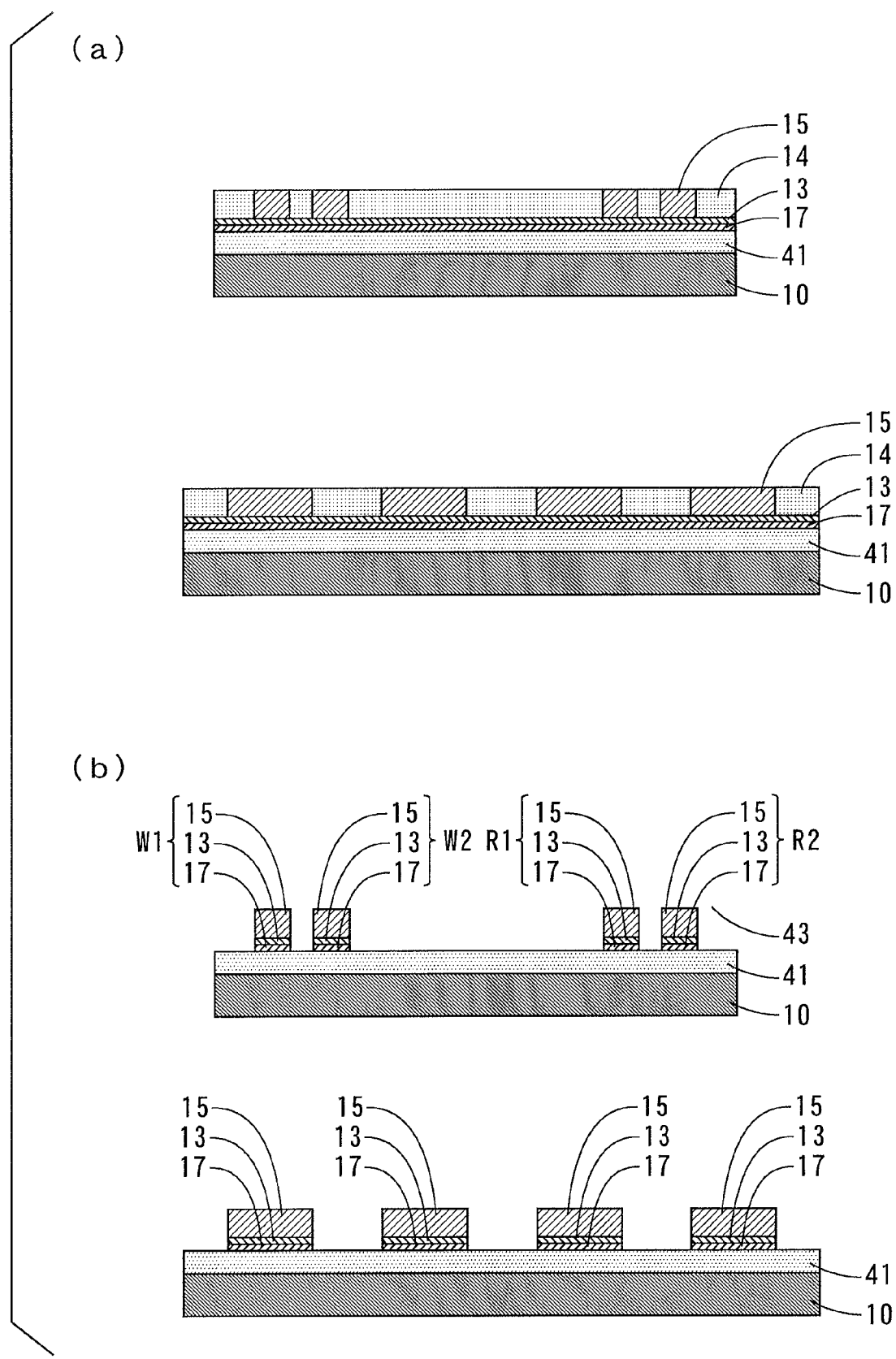
FIGS. 15 (a) and (b) are schematic sectional views illustrating steps of manufacturing the suspension board illustrated in FIG. 1.

Then, as illustrated in FIG. 15 (*a*), a copper plating layer 15 is formed on the copper plating base 13 by electrolytic plating of copper. Then, as illustrated in FIG. 15 (*b*), after the resist 14 is removed, an exposed portion of the copper plating base 13 and a portion under the exposed portion of the chromium film 17 by etching using an alkaline processing liquid. In the cross section in the upper portion of FIG. 15 (*b*), the chromium film 17, the copper plating base 13, and the copper plating layer 15, which remain on the insulating layer 41, form each of write wiring traces W1 and W2 and read wiring traces R1 and R2.

The thickness of each of the write wiring traces W1 and W2 and the read wiring traces R1 and R2 is not less than 6 μm nor more than 18 μm, for example. The width of each of the write wiring traces W1 and W2 and the read wiring traces R1 and R2 is not less than 8 μm nor more than 50 μm, for example. Further, each of a spacing between the write wiring traces W1 and W2 and a spacing between the read wiring traces R1 and R2 is not less than 8 μm nor more than 20 μm, for example.

Then, a nickel film (not illustrated) having a thickness of not less than 0.05 μm nor more than 0.1 μm, for example, is formed on the support substrate 10 and the copper plating layer 15 by non-electrolytic plating of nickel. The nickel film is provided to improve adhesion between the copper plating layer 15 and a coating layer 43, which will be formed in a later step, and to prevent migration of copper.

Figure 16:
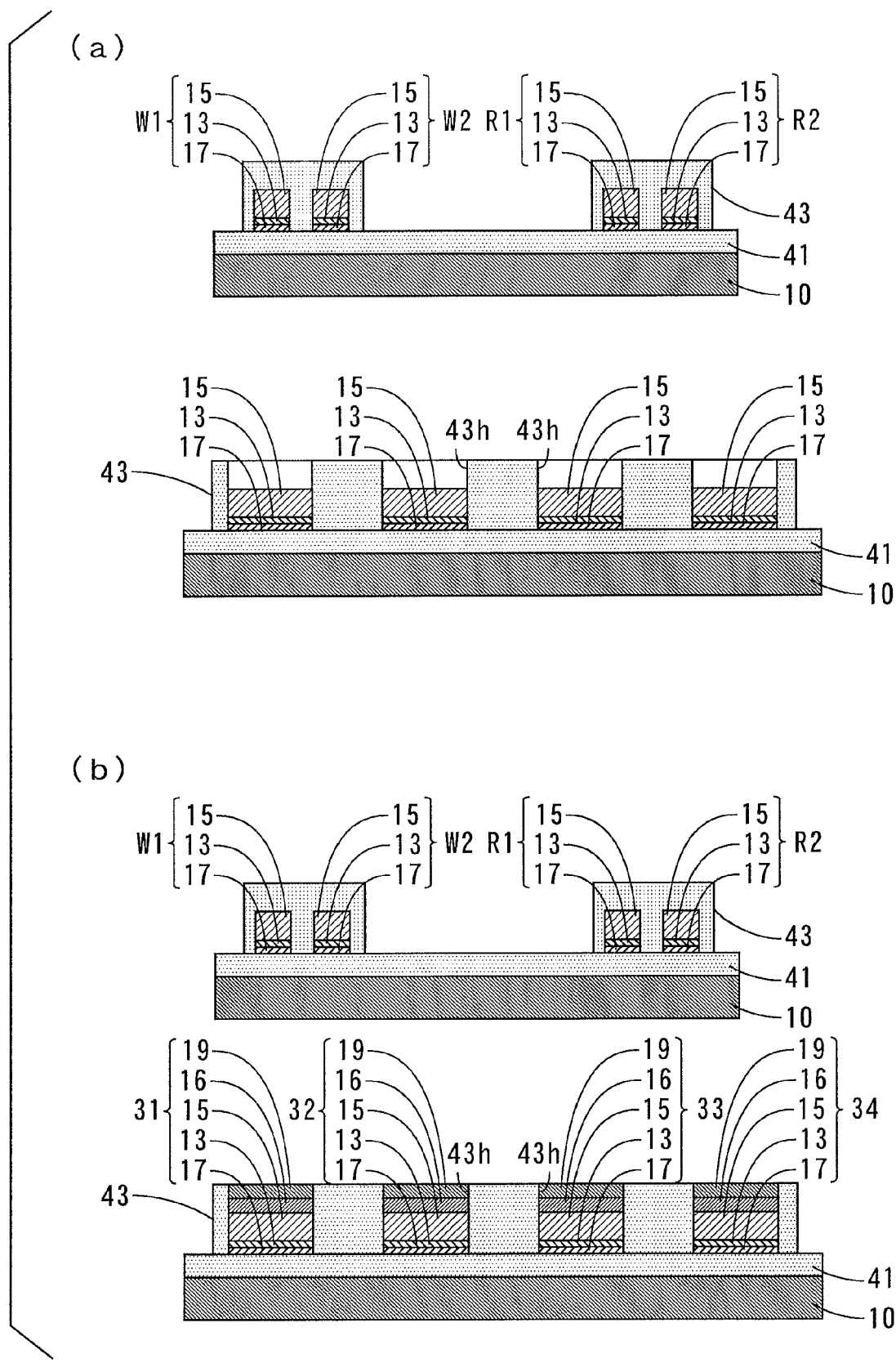
FIGS. 16 (a) and (b) are schematic sectional views illustrating steps of manufacturing the suspension board illustrated in FIG. 1.

Then, the nickel film and the insulating layer 41 are coated with a photosensitive polyimide resin precursor, and exposure processing, heating processing, development processing, and heat curing processing are performed in this order so that the coating layer 43 made of polyimide is formed on the insulating layer 41 and the nickel film, as illustrated in FIG. 16 (*a*). The thickness of the coating layer 43 is not less than 2 μm nor more than 10 μm, for example. The coating layer 43 has openings 43*h* respectively corresponding to positions where the electrode pads 21 to 24 and the electrode pads 31 to 34 illustrated in FIG. 1 are formed.

Then, after the nickel film (not illustrated) on the copper plating layer 15, which is exposed in the opening 43*h* of the coating layer 43, is stripped, a nickel film 16 having a thickness of 1 μm to 5 μm, for example, and a gold plating layer 19 having a thickness of 1 μm to 5 μm, for example, are formed by electrolytic plating in the opening 43*h* of the coating layer 43, as illustrated in FIG. 16 (*b*). Thus, the chromium film 17, the copper plating base 13, the copper plating layer 15, the nickel film 16, and the gold plating layer 19 form each of the electrode pads 31 to 34, as illustrated in the cross section in the lower portion of FIG. 16 (*b*).

Figure 17:
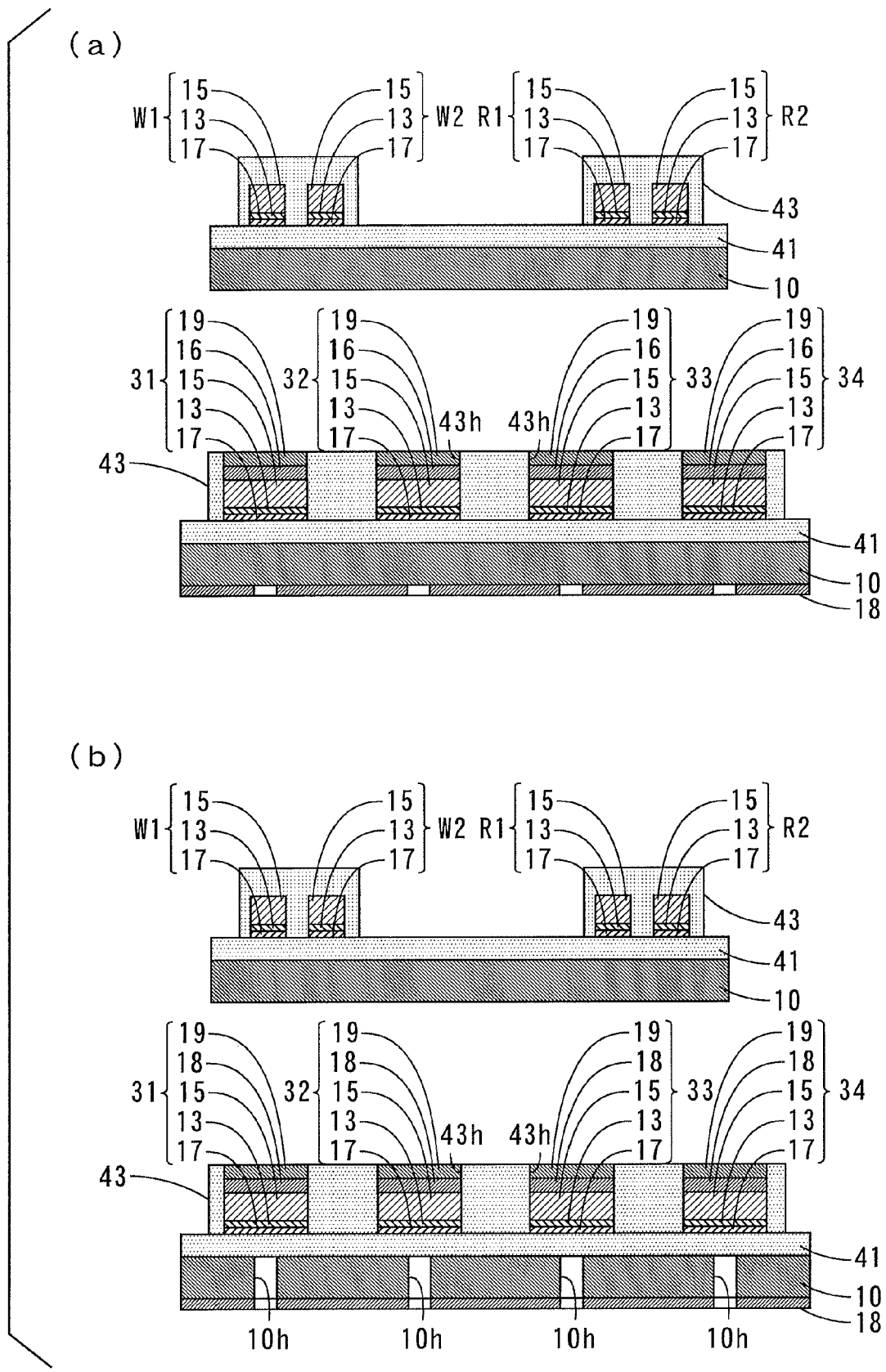
FIGS. 17 (a) and (b) are schematic sectional views illustrating steps of manufacturing the suspension board illustrated in FIG. 1.

Then, as illustrated in FIG. 17 (*a*), an etching resist 18 having openings in parts of regions of the support substrate 10, which respectively overlap the electrode pads 31 to 34, is formed. Then, as illustrated in FIG. 17 (*b*), openings 10*h* are formed in the support substrate 10 by etching the support substrate 10 using a ferric chloride solution and a cupric chloride solution. Then, as illustrated in FIG. 18, the etching resist 18 is removed, to complete the suspension board 1.

(8) Effects

In the suspension board 1 according to the above-mentioned embodiment, one or a plurality of openings 10*h* are selectively formed in each of the regions of the support substrate 10, which overlap the plurality of electrode pads 31 to 34. In this case, a capacitive component of each of the plurality of electrode pads 31 to 34 is selectively reduced. Thus, the characteristic impedance of each of the plurality of electrode pads 31 to 34 can be made higher than when no openings 10*h* are formed. The characteristic impedance of each of the plurality of electrode pads 31 to 34 can be adjusted optionally by adjusting the aperture ratio of the openings 10*h* in the support substrate 10. Particularly, the characteristic impedance of the electrode pads 33 and 34 respectively connected to the read wiring traces R1 and R2 can be made higher than the characteristic impedance of the electrode pads 31 and 32 respectively connected to the write wiring traces W1 and W2 by making the aperture ratio of the openings 10*h* corresponding to the electrode pads 33 and 34 higher than the aperture ratio of the openings 10*h* corresponding to the electrode pads 31 and 32.

(9) Another Embodiment (9-1) While in the above-mentioned embodiment, the regions of the support substrate 10, which overlap the plurality of electrode pads 31 to 34, are removed so that the characteristic impedance of each of the plurality of electrode pads 31 to 34 is adjusted, the present invention is not limited to this. Openings 10*h* may be formed in regions of a support substrate 10, which overlap a plurality of electrode pads 21 to 24, in a similar method to that illustrated in FIGS. 3 to 12 by removing the regions of the support substrate 10, which overlap the electrode pads 21 to 24. Thus, a characteristic impedance of each of the plurality of electrode pads 21 to 24 can be adjusted optionally.

(9-2) While in the above-mentioned embodiment, the opening 10*h* has a rectangular shape, the present invention is not limited to this. The opening 10 may have a circular shape, elliptical shape, diamond shape, polygonal shape, or other shapes.

(10) Correspondences Between Elements in the Claims and Parts in Embodiments In the following paragraphs, non-limiting examples of correspondences between various elements recited in the claims below and those described above with respect to various preferred embodiments of the present invention are explained.

In the embodiment, described above, the suspension board 1 is an example of a printed circuit board, the support substrate 10 is an example of a support substrate, the insulating layer 41 is an example of a first insulating layer, and the coating layer 43 is an example of a second insulating layer. The write wiring traces W1 and W2 and the read wiring traces R1 and R2 are examples of a wiring trace, the electrode pads 31 and 32 are examples of a connection terminal or a first connection terminal, and the electrode pads 33 and 34 are examples of a connection terminal or a second connection terminal, and the opening 10h is an example of an opening or a first or second opening.

As each of various elements recited in the claims, various other elements having configurations or functions described in the claims can be also used.

(11) Inventive Examples

(11-1) Suspension Board

In inventive examples 1 to 14 and a comparative example 1, described below, a characteristic impedance of electrode pads 31 and 32 was evaluated for a plurality of suspension boards 1, which differ in aperture ratios of openings 10h in a support substrate 10.

Figure 19:
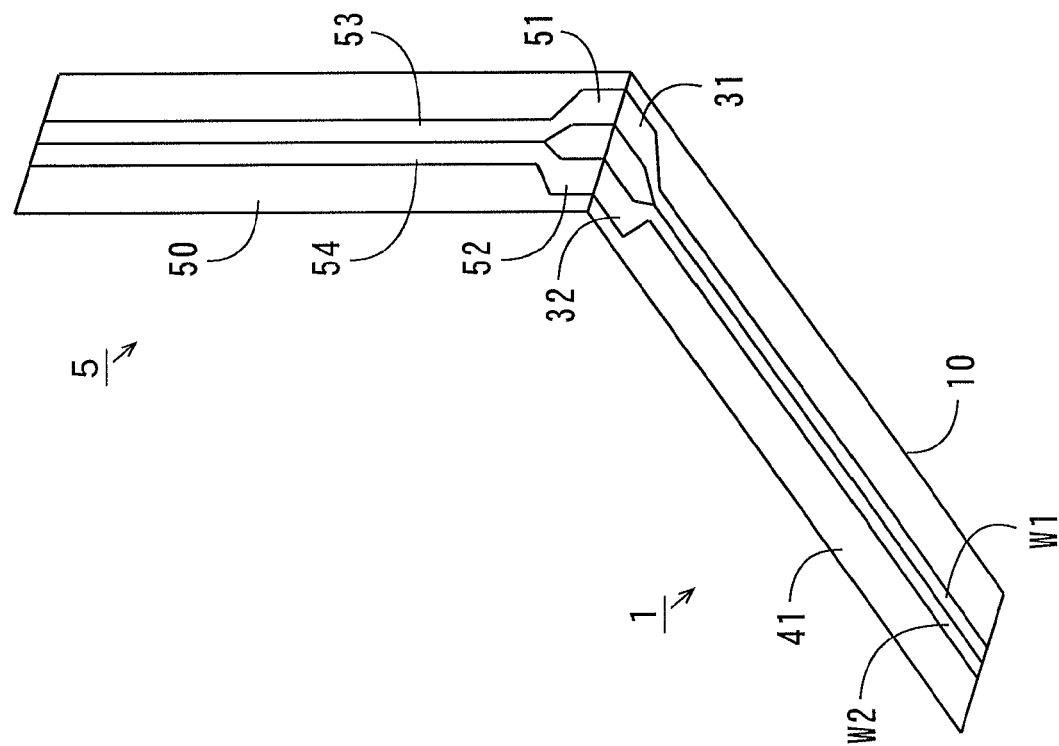
FIG. 19 is a perspective view of a suspension board in each of inventive examples 1 to 14 and a comparative example 1.

FIG. 19 is a perspective view of the suspension board 1 in each of the inventive examples 1 to 14 and the comparative example 1. As illustrated in FIG. 19, the suspension board 1 in each of the inventive examples 1 to 14 and the comparative example 1 is connected to a flexible printed circuit board (hereinafter referred to as an FPC board) 5.

While the FPC board 5 is connected to the suspension board 1 vertically in FIG. 19 and FIGS. 20 to 22, described below, the FPC board 5 may be connected to the suspension board 1 horizontally, or may be connected to the suspension board 1 at another angle.

The suspension board 1 in each of the inventive examples 1 to 14 and the comparative example 1 includes a long-sized support substrate 10, an insulating layer 41, electrode pads 31 and 32, and write wiring traces W1 and W2. The electrode pads 31 and 32 and the write wiring traces W1 and W2 are formed on the support substrate 10 with the insulating layer 41 sandwiched therebetween. The electrode pads 31 and 32 are spaced apart from each other at one end in a longitudinal direction of the support substrate 10. The write wiring traces W1 and W2 are parallel to each other to extend in the longitudinal direction of the support substrate 10. The electrode pads 31 and 32 are integrally formed, respectively, at ends of the write wiring traces W1 and W2.

The FPC board 5 includes a long-sized insulating layer 50, electrode pads 51 and 52, and wiring traces 53 and 54. The electrode pads 51 and 52 and the wiring traces 53 and 54 are formed on the insulating layer 50. The electrode pads 51 and 52 are spaced apart from each other at one end in a longitudinal direction of the insulating layer 50. The wiring traces 53 and 54 are parallel to each other to extend in the longitudinal direction of the insulating layer 50. The electrode pads 51 and 52 are integrally formed, respectively, at ends of the wiring traces 53 and 54.

Figure 20:
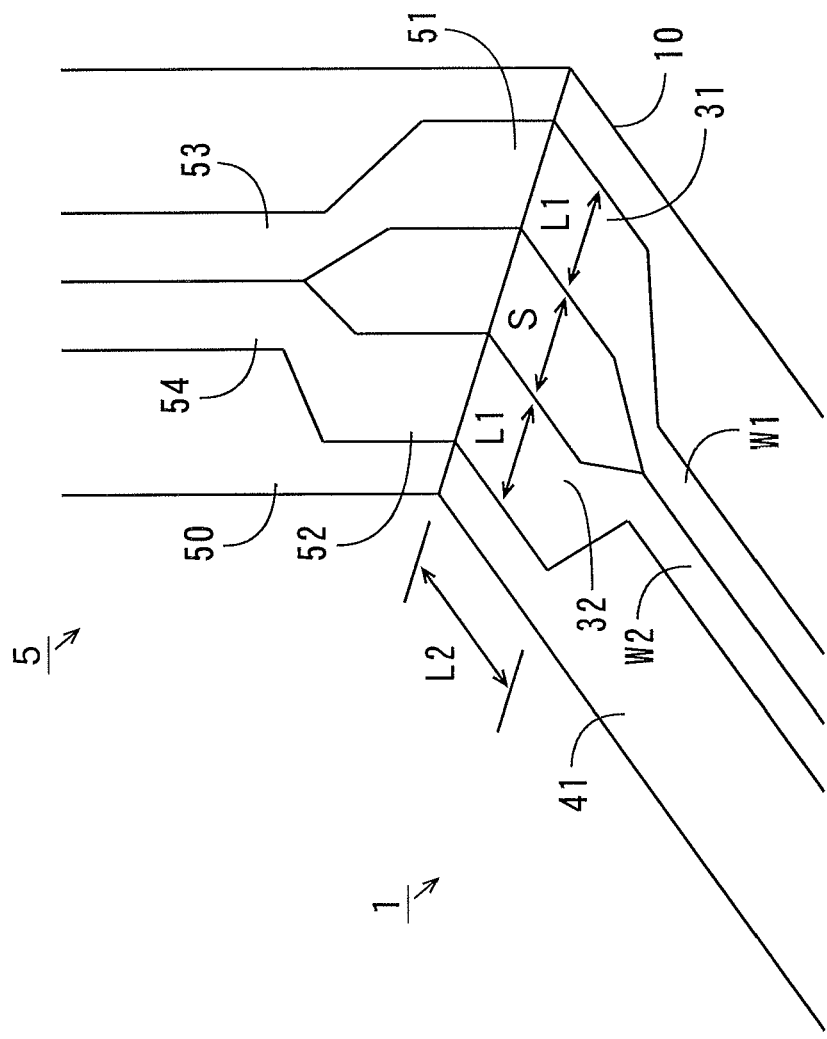
FIG. 20 is an enlarged view of a coupling portion between a suspension board and an FPC board.
Figure 21:
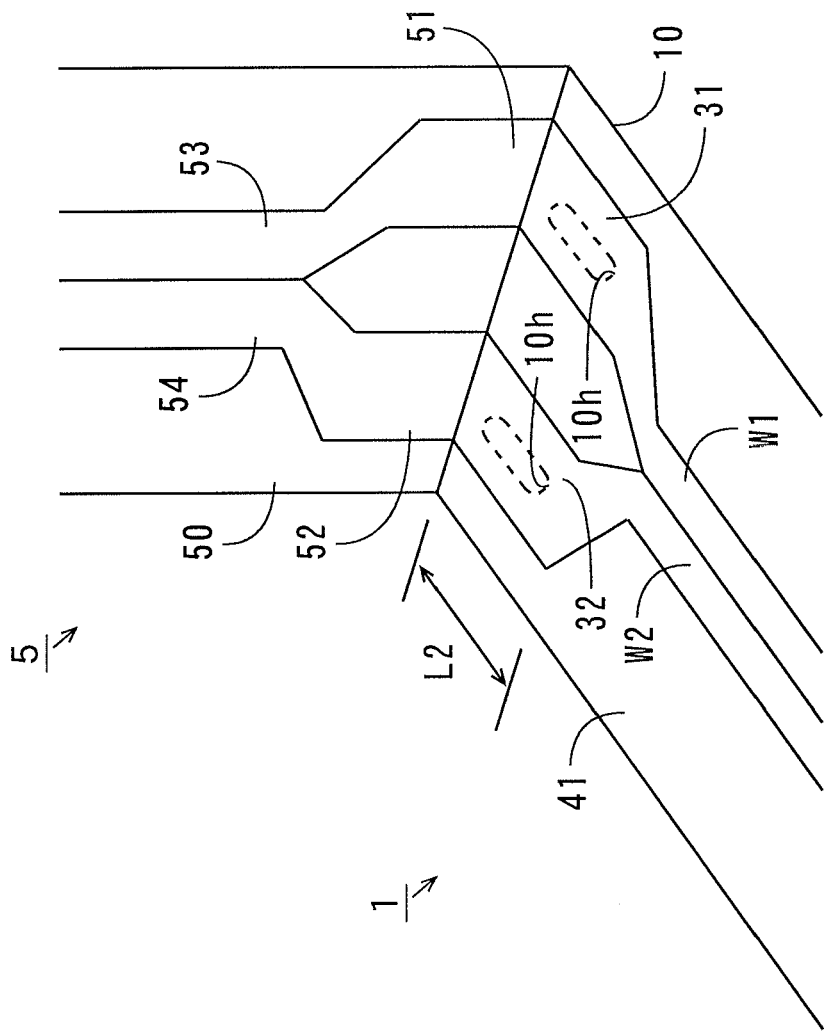
FIG. 21 is an enlarged view of a coupling portion between a suspension board and an FPC board.
Figure 22:
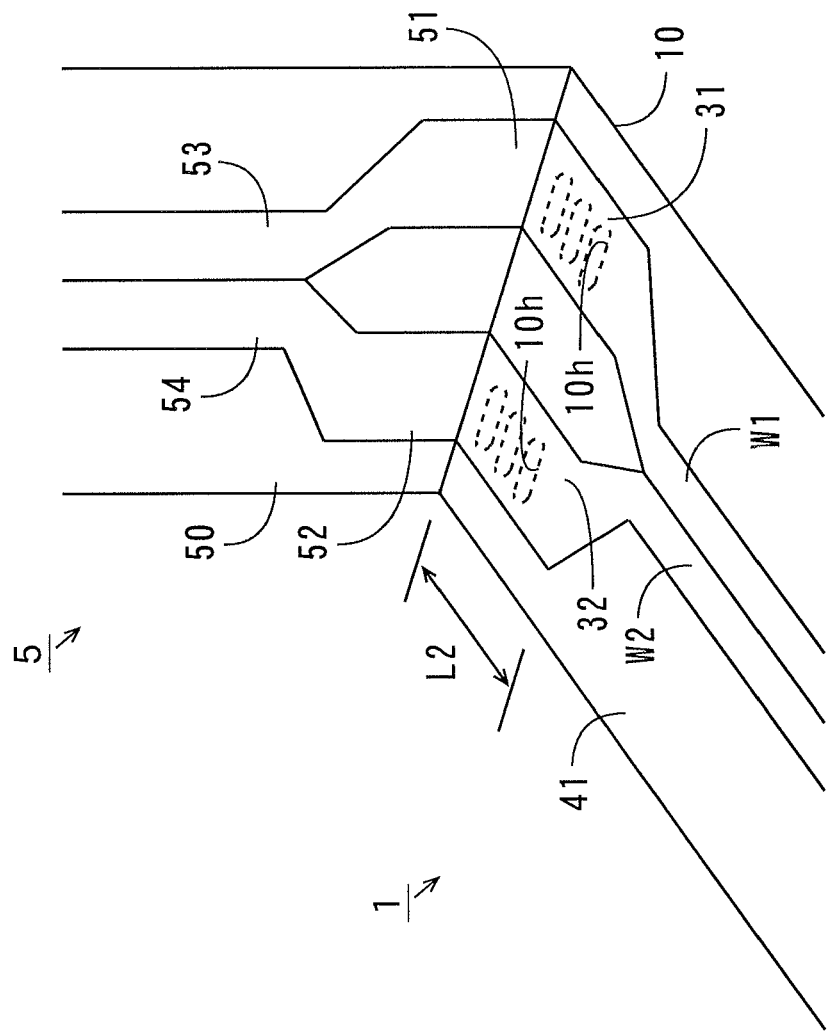
FIG. 22 is an enlarged view of a coupling portion between a suspension board and an FPC board.

The electrode pads 31 and 32 in the suspension board 1 and the electrode pads 51 and 52 in the FPC board 5 are electrically connected to each other with soldering, respectively. FIGS. 20, 21 and 22 are enlarged views of a coupling portion between the suspension board 1 and the FPC board 5. As illustrated in FIG. 20, the width L1 of each of the electrode pads 31 and 32 in a width direction of the suspension board 1 is 300 μm. The width L2 of each of the electrode pads 31 and 32 in a longitudinal direction of the suspension board 1 is 700 μm. A spacing S between the electrode pads 31 and 32 is 250 μm.

The width of each of the write wiring traces W1 and W2 in the width direction of the suspension board 1 is 120 μm. A spacing between the write wiring traces W1 and W2 is 15 μm. A characteristic impedance of each of the write wiring traces W1 and W2 is 43Ω. The width of each of the wiring traces 53 and 54 in a width direction in the FPC board 5 is 235 μm. A spacing between the wiring traces 53 and 54 is 40 μm. A characteristic impedance of each of the wiring traces 53 and 54 is 42Ω.

In the suspension board 1 in each of the inventive examples 1 to 7, respective openings 10h were formed in regions of the support substrate 10, which respectively overlap the electrode pads 31 and 32, as illustrated in FIG. 21. By adjusting the area of each of the openings 10h formed in the support substrate 10, an aperture ratio of the opening 10h was adjusted. The aperture ratios of the openings 10h in the suspension boards 1 in the inventive examples 1 to 7 are respectively 18.67%, 32.33%, 56.14%, 79.48%, 91.86%, 99.00% and 100.00%.

In the suspension board 1 in each of the inventive examples 8 to 14, a plurality of openings 10h having the same area were formed in each of regions of the support substrate 10, which respectively overlap the electrode pads 31 and 32, as illustrated in FIG. 22. By adjusting the number of openings 10h formed in the support substrate 10, an aperture ratio of the openings 10h was adjusted. The aperture ratios of the openings 10h in the suspension boards 1 in the inventive examples 8 to 14 were respectively 18.67%, 32.33%, 56.14%, 79.48%, 91.86%, 99.00% and 100.00%.

In the suspension boards 1 in the comparative example 1, no openings 10h were formed in the support substrate 10. More specifically, the aperture ratio of the openings 10h in the suspension board 1 in the comparative example 1 was 0%.

(11-2) Characteristic Impedance

For the suspension board 1 in each of the inventive examples 1 to 14 and the comparative example 1, a characteristic impedance of the electrode pads 31 and 32 was found by simulation. Their results are illustrated in Table 1.

TABLE 1

|  | APERTURE RATIO [%] | CHARACTERISTIC IMPEDANCE [Ω] |
| --- | --- | --- |
| INVENTIVE EXAMPLE 1 | 18.67 | 31.96 |
| INVENTIVE EXAMPLE 2 | 32.33 | 32.80 |
| INVENTIVE EXAMPLE 3 | 56.14 | 35.39 |
| INVENTIVE EXAMPLE 4 | 79.48 | 40.08 |
| INVENTIVE EXAMPLE 5 | 91.86 | 48.43 |
| INVENTIVE EXAMPLE 6 | 99.00 | 53.06 |
| INVENTIVE EXAMPLE 7 | 100.00 | 64.07 |
| INVENTIVE EXAMPLE 8 | 18.67 | 31.96 |

TABLE 1-continued

| | APERTURE RATIO [%] | CHARACTERISTIC IMPEDANCE [Ω] |
|---|---|---|
| INVENTIVE EXAMPLE 9 | 32.33 | 32.80 |
| INVENTIVE EXAMPLE 10 | 56.14 | 35.39 |
| INVENTIVE EXAMPLE 11 | 79.48 | 40.08 |
| INVENTIVE EXAMPLE 12 | 91.86 | 48.43 |
| INVENTIVE EXAMPLE 13 | 99.00 | 53.06 |
| INVENTIVE EXAMPLE 14 | 100.00 | 64.07 |
| COMPARATIVE EXAMPLE 1 | 0.00 | 30.50 |

As illustrated in Table 1, the characteristic impedances of the electrode pads 31 and 32 in the inventive examples 1 to 7 were respectively 31.96Ω, 32.80Ω, 35.39Ω, 40.08Ω, 48.43Ω, 53.06Ω and 64.07Ω. The characteristic impedances of the electrode pads 31 and 32 in the inventive examples 8 to 14 were respectively 31.96Ω, 32.80Ω, 35.39Ω, 40.08Ω, 48.43Ω, 53.06Ω and 64.07Ω. The characteristic impedances of the electrode pads 31 and 32 in the comparative example 1 were 30.50Ω.

The results in the inventive examples 1 to 14 and the comparative example 1 proved that the characteristic impedance of the electrode pads 31 and 32 could be increased by forming the openings 10h in the regions of the support substrate 10, which respectively overlap the electrode pads 31 and 32. The results in the inventive examples 1 to 14 proved that the characteristic impedance increased with an increase in the aperture ratio of the openings 10h. Further, the results in the inventive examples 1 to 7 and the inventive examples 8 to 14 proved that even if the respective areas or the respective numbers of openings 10h formed in the regions of the support substrate 10, which respectively overlap the electrode pads 31 and 32, differ, the respective characteristic impedances of the electrode pads 31 and 32 were equal if the respective aperture ratios of the openings 10h were equal.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A printed circuit board that can be electrically connected to an external circuit, comprising:
   a support substrate formed of a conductive material;
   a first insulating layer formed on said support substrate;
   a plurality of wiring traces formed on said first insulating layer; and
   a plurality of connection terminals that are respectively formed in parts of said plurality of wiring traces on said first insulating layer and can be electrically connected to said external circuit,
   wherein one or a plurality of openings are formed in said support substrate to at least partially overlap one or more of said plurality of connection terminals,
   said plurality of connection terminals include first and second connection terminals,
   said one or plurality of openings include one or a plurality of first openings that at least partially overlap said first connection terminal and one or a plurality of second openings that at least partially overlap said second connection terminal, and
   the sum of the areas of said one or plurality of first openings that overlap said first connection terminal and the sum of the areas of said one or plurality of second openings that overlap said second connection terminal differ.

2. A printed circuit board that can be electrically connected to an external circuit, comprising:
   a support substrate formed of a conductive material;
   a first insulating layer formed on said support substrate;
   a plurality of wiring traces formed on said first insulating layer; and
   a plurality of connection terminals that are respectively formed in parts of said plurality of wiring traces on said first insulating layer and can be electrically connected to said external circuit,
   wherein one or a plurality of openings are formed in said support substrate to at least partially overlap one or more of said plurality of connection terminals, and
   said one or plurality of openings are formed so that a characteristic impedance of one of said plurality of connection terminals is lower than a characteristic impedance of the other connection terminals.

3. The printed circuit board according to claim 1, wherein said plurality of connection terminals include first and second connection terminals, and
   said one or plurality of openings include one or a plurality of first openings that at least partially overlap said first connection terminal and one or a plurality of second openings that at least partially overlap said second connection terminal.

4. The printed circuit board according to claim 3, wherein when the ratio of the area of the opening, which overlaps each of said connection terminals, to the area of said connection terminal is defined as an aperture ratio, the aperture ratio of said one or plurality of first openings and the aperture ratio of said one or plurality of second openings differ.

5. The printed circuit board according to claim 1, further comprising:
   a second insulating layer formed on said first insulating layer to cover said plurality of wiring traces while exposing surfaces of said plurality of connection terminals.

6. A method for manufacturing a printed circuit board that can be electrically connected to an external circuit, comprising the steps of:
   preparing a laminated structure of a support substrate having a conductive property and an insulating layer;
   forming a plurality of wiring traces on said insulating layer while forming a plurality of connection terminals, which can be electrically connected to said external circuit in parts of said plurality of wiring traces, respectively; and
   forming one or a plurality of openings in said support substrate to at least partially overlap one or more of said plurality of connection terminals,
   wherein the step of forming said openings includes forming said one or plurality of openings so that a characteristic impedance of one of said plurality of connection terminals is lower than a characteristic impedance of the other connection terminal.

* * * * *